United States Patent [19]

Tuttle

[11] 4,070,632
[45] Jan. 24, 1978

[54] DISCRETE-GAIN OUTPUT LIMITER

[76] Inventor: John R. Tuttle, 9116 Orlando Place N.E., Albuquerque, N. Mex. 87111

[21] Appl. No.: 725,464

[22] Filed: Sept. 22, 1976

[51] Int. Cl.² .......................... H03F 1/36; H03G 3/20
[52] U.S. Cl. ...................................... 330/86; 330/136; 330/144
[58] Field of Search .................. 330/29, 86, 136, 144, 330/145

[56] References Cited

U.S. PATENT DOCUMENTS

| 2,930,987 | 3/1960 | Groce et al. | 330/136 |
| 3,158,818 | 11/1964 | Plumpe | 330/136 X |
| 3,315,223 | 4/1967 | Hibbard et al. | 330/86 UX |
| 3,392,370 | 7/1968 | Neitzel | 330/144 UX |
| 3,464,022 | 8/1969 | Locheed et al. | 330/144 |
| 3,579,138 | 5/1971 | Harris et al. | 330/86 |
| 3,699,948 | 10/1972 | Ota et al. | 330/29 X |
| 3,879,672 | 4/1975 | Milanes | 330/29 |
| 3,969,683 | 7/1976 | Fabricius | 330/144 |

Primary Examiner—James B. Mullins
Attorney, Agent, or Firm—Merchant, Gould, Smith, Edell, Welter & Schmidt

[57] ABSTRACT

An improved gain control circuit for an amplifier having a plurality of parallel connected resistors each having a series switch to selectively switch the resistor into the control circuit to vary the gain incrementally as some continuous function of amplifier input voltage. In one embodiment, the parallel resistors are connected between the amplifier input and output. Alternatively, the parallel resistors may be connected as the amplifier input resistance. A peak follower circuit monitors the amplifier input and applies an output control voltage to a plurality of comparators each having a separate reference voltage. Each comparator generates an output signal when the control voltage exceeds its associated reference and this output is connected to one of the resistor switches to change the parallel resistance incrementally generating a corresponding incremental gain variation. In an alternative embodiment, the comparator outputs are connected to data flip flops having complementary outputs triggered by pulses from a clock pulse circuit. The pulse circuit generates a pulse upon each zero crossing of the amplifier input so that incremental gain changes occur only at zero crossings of the amplifier input.

7 Claims, 4 Drawing Figures

FIG. 2

DISCRETE-GAIN OUTPUT LIMITER

BACKGROUND OF THE INVENTION

This invention relates broadly to a gain control circuit for an audio amplifier. More particularly, the invention is a gain control circuit in which the amplifier voltage input is continuously monitored to generate a control voltage and the gain is incrementally varied in response to changes in the control voltage.

It is known in the prior art that the gain of an operational amplifier can be regulated by controlling the amplifier feedback resistance. In some prior art devices, amplifier gain is made to vary continuously with respect to the amplifier input voltage. Such gain control is particularly objectionable in high fidelity systems in that it generates an amplifier wave output having a frequency spectrum which differs from that of the amplifier input.

In other prior art devices, the amplifier voltage input may be periodically sampled to provide a resistance control signal. In audio preamplifier systems, it is preferable to continuously monitor the amplifier input and regulate the amplifier gain accordingly. By continuously monitoring the voltage input, the gain control circuit deals with transients that may go undetected by a periodic sampling system, and thus create undesirable output spikes.

In yet another prior art device, the amplifier gain is adjusted by selectively switching a plurality of resistors connected in parallel between the input and output of the amplifier. In this device, the gain is preset to provide an output signal of a predetermined magnitude for an input signal which occurs during the presetting or adjustment period. This device is particularly inapplicable in the audio amplifier environment where it is desired to maintain a constant magnitude output in response to continuously varying input magnitudes.

The present invention overcomes the disadvantages of the prior art gain control systems in that it is a circuit that continuously monitors the amplifier input voltage and accordingly adjusts the amplifier gain in discrete increments. The device is particularly useful in high fidelity audio amplifier equipment where it is desired to maintain a constant magnitude output in response to varying inputs while simultaneously preserving the frequency characteristics of the input signal.

SUMMARY OF THE INVENTION

The present invention is an improved gain control circuit for an amplifier and includes means for continuously monitoring the amplifier input voltage to produce control voltage, and means for incrementally varying the amplifier gain in response to changes in the control voltage.

In one embodiment, a plurality of resistors is connected in parallel between the amplifier input and output. In series with each resistor is a switch which is selectively opened or closed to vary the amplifier feedback resistance and thus control the amplifier gain in discrete steps. The input voltage monitoring circuit is a continuous peak follower and produces a voltage output which is applied to a plurality of voltage comparators, each having a separate reference voltage. The output of each voltage comparator is connected to one of the switches in the feedback circuit so that when the control voltage exceeds the comparator reference, the switch is turned on to place the associated resistor in the feedback circuit. Conversely, when the control voltage drops below the reference voltage, the switch is turned off to remove the resistor from the circuit.

In an alternative embodiment, the outputs of the voltage comparators are fed to data flip flops having complementary outputs triggered by a clock pulse. One output of the complementary outputs of each flip flop is connected to a resistor switch. A clock pulse generator produces a pulse at each zero crossing of the amplifier input voltage to trigger the flip flop output so that the incremental gain changes occur at the zero crossing.

In a third embodiment, the gain of the amplifier is regulated by a plurality of input resistors connected in parallel and having associated series switches. The switches are connected to the other complementary output of the data flip flops so that the associated resistor is in the parallel circuit when the control voltage is below a reference voltage, and the switch is opened to remove the resistance from the parallel circuit when the control voltage exceeds the reference voltage.

DESCRIPTION OF THE PREFERRED EMBODIMENT

Figure 1:
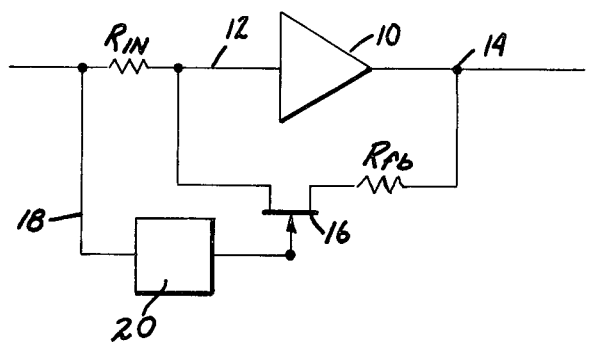
FIG. 1 is a schematic representation illustrating the principle of operation of one embodiment of the subject invention.

Referring to the drawings, wherein like numerals represent like parts throughout the several views, FIG. 1 illustrates broadly the operation of the present invention. An amplifier 10 has input and output terminals 12 and 14, respectively. Connected between the amplifier input 12 and output 14 in a feedback path is a switch 16. The switch is controlled by a signal which is a continuous function of the amplifier input voltage which is supplied along a control path 18 to a control circuit 20. In the preferred embodiment, the signal applied to the switch is generated by an input voltage peak follower circuit. When the switch is closed completing the feedback path between amplifier input and output terminals, a resistor $R_{fb}$ is introduced into the amplifier feedback circuit. It is known in the art that the amplifier gain G is equal to $R_{fb}$ divided by the amplifier input impedance $R_{in}$.

Thus by selectively opening and closing the switch 16 in the feedback path, the gain G of the amplifier 10 is varied in discrete incremental steps. In the preferred embodiment, the switch control voltage on path 18 is an input voltage peak follower. The control voltage could also be generated by averaging the input voltage.

Figure 2:
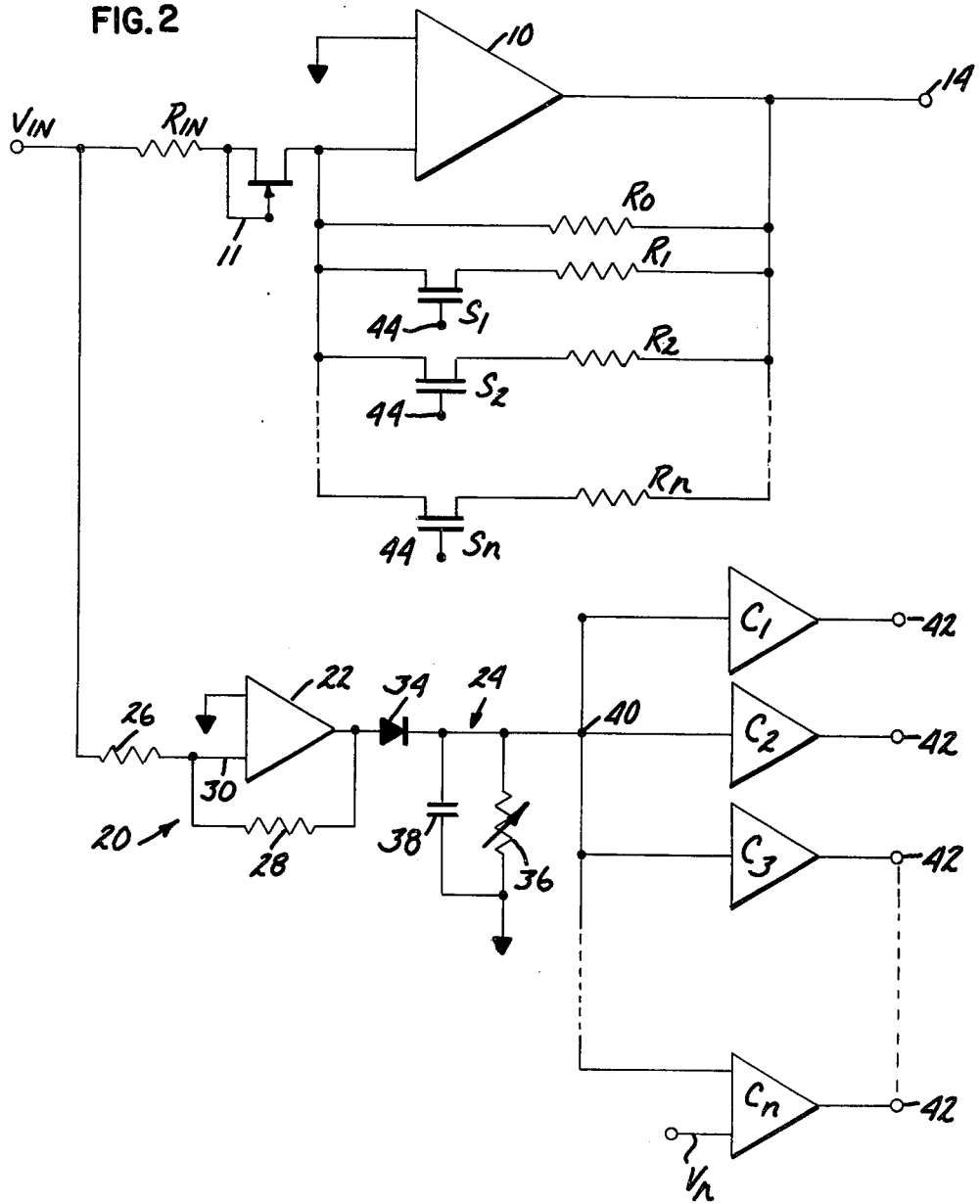
FIG. 2 is the amplifier and gain control circuit of one embodiment of the present invention.

FIG. 2 illustrates the actual working circuit of the preferred embodiment disclosed broadly in FIG. 1. A plurality of resistors $R_0 - R_n$ are connected in parallel between the input 12 and output 14 terminals of the amplifier 10. A switch 11 is placed in series with the voltage input to compensate for non-linearities in the characteristics of the switches $S_1 - S_n$. The resistor $R_0$ establishes a reference gain $G_0$ of the amplifier equal to $R_0$ divided by $R_{in}$. Each of the additional resistors, $R_1$ through $R_n$, is associated with a corresponding one of the switches, $S_1$ through $S_n$. The total feedback resistance is thus determined by the condition of each of the switches. Opening and closing of the switches causes an incremental change in the feedback resistance generating a corresponding incremental change in the gain. In the preferred embodiment, the switches $S_1 - S_n$ are field effect transistors regulated by a control signal voltage.

The amplifier input voltage $V_{in}$, in addition to being applied to the amplifier input 12, is also fed to a voltage peak following circuit designated generally as 20. The peak following circuit includes an amplifier 22 and an RC network 24. Associated with the amplifier is an input resistor 26 and a feedback resistor 28 connecting the amplifier input 30 and the output 32. A diode 34 is placed between the output 32 of the amplifier 22 and the RC network 24. The amplifier 22 has a sufficient gain to boost the input signal to a value sufficient to switch a plurality of field effect transistors. The rectifying diode 34 generates a half-wave signal from the boosted amplifier output 32.

The RC network includes a variable resistor 36 and a capacitor 38. The time constant of the RC network may be regulated by the variable resistor to control the characteristics of the circuit. The half-wave signal from the diode 34 is applied to the RC network which produces a control voltage 40 which follows input voltage peaks. The input is monitored continuously and changes in magnitude of the input voltage $V_{in}$ produce a corresponding change in the control voltage output.

The control voltage signal is applied to the input of a plurality of voltage comparators $C_1 - C_n$. Each comparator has a distinct and separate value reference voltage $V_n$. The comparators generate an output signal at 42 when control voltage exceeds their respective reference voltages. The generated signals at 42 are applied to the inputs 44 of the switches $S_1 - S_n$. As a switch is closed introducing an additional resistor in parallel, the total feedback resistance $R_{fb}$ decreases in a discrete increment resulting in a corresponding incremental decrease in the gain of the amplifier 10. Conversely, as the input at 40 decreases, fewer signals are supplied at the terminals 42 and thus the terminals 44. The switches $S_1 - S_n$ open in successive increments resulting in an incremental increase in the feedback resistance. The increase in the resistance $R_{fb}$ results in an increased gain for the amplifier 10.

Figure 3:
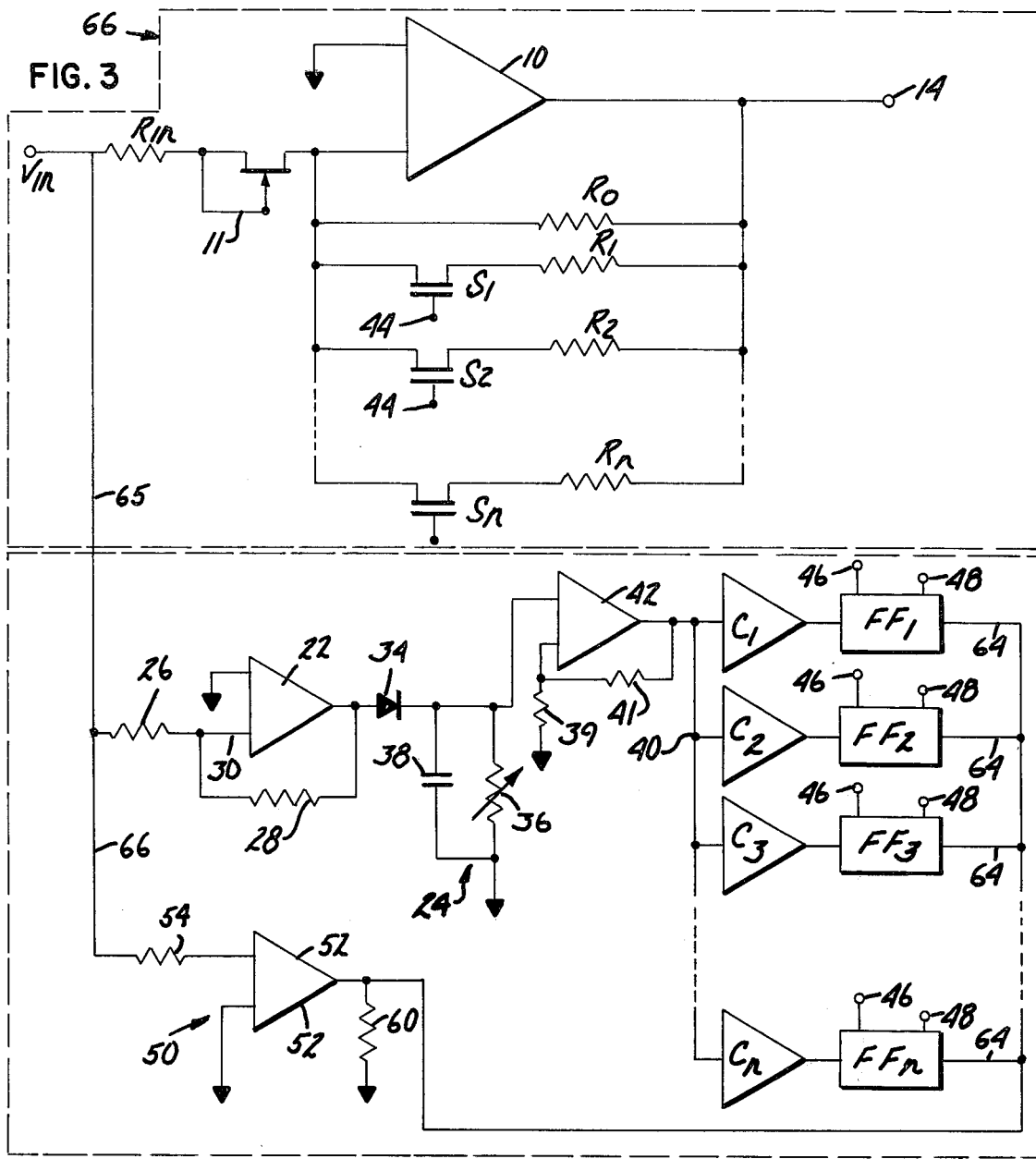
FIG. 3 is an alternative embodiment of the invention disclosed in FIG. 2 and illustrates the addition of data flip flops and a clock pulse circuit to the gain control systems.

An alternative embodiment as illustrated in FIG. 3 includes an amplifier circuit designated generally as 66 and a circuit 68 for generating a gain switching signal. The outputs of the voltage comparators $C_1 - C_n$ are fed to a plurality of data flip flops $FF_1 - FF_n$. Each data flip flop has complementary outputs 46 and 48 and a clock pulse input 64. Connected to the voltage input $V_{in}$ through a line 66 is a clock pulse generator illustrated generally at 50. The clock pulse generator includes an amplifier 52, an input resistor 54, and a load resistor 60. The clock pulse generator produces an output pulse on line 64 each time sinusoidal input voltage crosses a zero reference. The clock pulses activate the data flip flops at each such zero crossing. The outputs 46 of the flip flops are connected to the switch terminals 44, and thus at each zero crossing of the input voltage any signal on the outputs 46 is transmitted to the switches $S_n$. The existence of a signal at the outputs 46 which would turn on the associated switch is, of course, determined by the output from the comparator associated with each data flip flop. By incrementally varying the gain of the amplifier only at zero crossings of the voltage input, a smoother transition from one gain level to another is achieved, thereby eliminating distortion in the amplifier output.

As shown in FIG. 3, an amplifier 42 and associated bias and feedback resistors 39 and 41 are connected between the control circuit 24 and the comparators $C_1 - C_n$. The amplifier boosts the control voltage output complementing the function of the amplifier 22 in generating a signal applied to the comparators.

Figure 4:
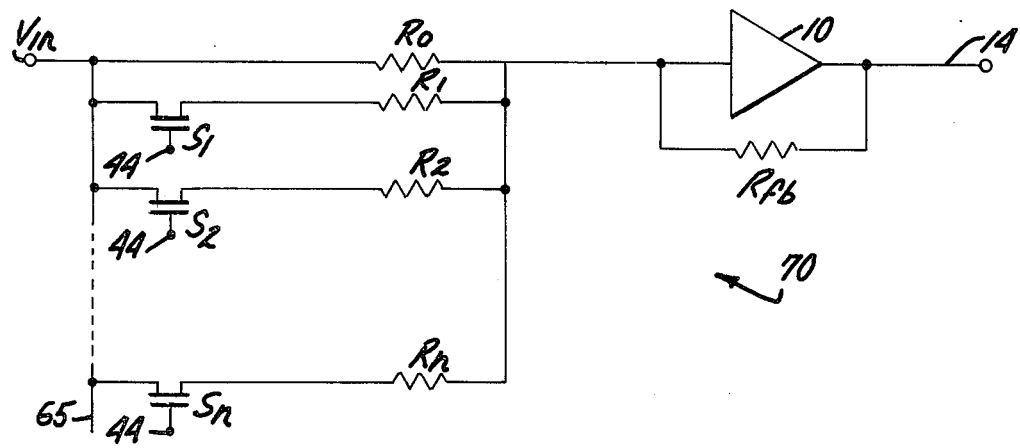
FIG. 4 illustrates an alternative embodiment of the present invention disclosed in FIG. 3 in which the input resistance of the amplifier is controlled to vary the amplifier gain.

In a third embodiment of the present invention, the amplifier circuit shown in FIG. 4 is substituted for the circuit 66 in FIG. 3. The third embodiment differs from the previous two primarily in that the incremental gain changes are achieved by varying the amplifier input resistance as opposed to varying the feedback resistance. More particularly, the resistances $R_1 - R_n$ and the associated series connected switches $S_1 - S_n$ are connected in parallel across the resistor $R_0$. As in the previous embodiments, with an increase in input voltage $V_{in}$, it is desirable to decrease the amplifier gain. In order to decrease the amplifier gain, the total input resistance must increase. The total input resistance will increase by removing a parallel connected resistor. In the third embodiment, therefore, the switches must be initially "on" and switched "off" when the control voltage exceeds the associated reference voltage.

The terminals 44 of the switches are thus connected to the complementary outputs 48 of the data flip flops. The signals on the complementary outputs 48 are positive maintaining the switches closed with the control below a reference voltage. When the control voltage exceeds the reference voltage, however, the signal at the complementary output 48 goes negative to turn off its associated switch. The gain control of the third embodiment also includes a clock pulse generator 50 for triggering the outputs of the data flip flops at the zero crossings of the input voltage $V_{in}$.

While the present invention has been disclosed as a gain limiter it is apparent that the circuit could be modified to function as an expander so that as the control voltage increases, amplifier gain also increases. Thus, for example, in FIG. 2 all resistors in the feedback path would be switched "on" for minimum gain. As the magnitude of the input voltage increased or decreased, control voltage would increase, turning off the feedback resistor switches and causing amplifier gain to increase.

The present invention, therefore, is directed toward varying the gain of an audio amplifier in discrete increments in either direction as a continuous function of the voltage input to the amplifier. The incremental gain variation is achieved by regulating either the amplifier input or feedback resistance. Additionally, the incremental changes in amplifier gain are designed to occur during zero crossings of the voltage input to achieve a smooth transition and eliminate audio distortion in the amplifier output.

I claim:

1. A discrete-gain amplifier having an input, an output, and a gain control circuit, the improvement in the gain control circuit comprising:
   a. means for continuously monitoring the input voltage to the amplifier and producing continuous control voltage output; and
   b. means for incrementally varying the gain of the amplifier in response to changes in said control voltage output, said means for incrementally varying the gain further comprising:

a plurality of resistors connected in parallel between the input and output of the amplifier;

switch means in series with each resistor for selectively connecting said resistor between the input and output of the amplifier;

a plurality of voltage comparators each having one input connected to the output of said voltage monitoring means, a second input connected to a reference voltage, and an output, said comparator generating a signal on said output when said control output exceeds said reference voltage; and means for connecting said output of each of said comparators to a different one of said switch means, whereby a resistor is connected between the input and output of the amplifier to vary the amplifier feedback resistance when said control voltage output exceeds a predetermined reference voltage.

2. An improved gain control circuit in accordance with claim 1 further comprising:

a plurality of data flip flops each having an input connected to the output of an associated comparator and complementary outputs, one of which is connected to an associated one of said switch means;

clock pulse generator means having an input connected to the voltage input of the amplifier and an output at which a pulse is generated upon each zero crossing of the amplifier input voltage; and means for connecting the output of said clock pulse generator to each of said data flip flops to allow passage of an output signal on said complementary outputs of said flip flops at each of said zero crossings.

3. An improved gain control circuit in accordance with claim 1 wherein said switch means are field effect transistors.

4. An improved gain control circuit in accordance with claim 1 wherein said voltage monitoring means further comprises:

an amplifier having an input connected to the variable gain amplifier input and an output;

a parallel resistor and capacitor; and a rectifying diode connected between the output of said amplifier and the parallel resistor and capacitor.

5. A discretegain amplifier having an input, an output, and a gain control circuit, the improvement in the gain control circuit comprising:

a. means for continuously monitoring the input voltage to the amplifier, and producing continuous control voltage output; and b. means for incrementally varying the gain of the amplifier in response to changes in said control voltage output, said incremental varying means further comprising:

a plurality of input resistors connected in parallel;

switch means in series with each resistor for selectively connecting said resistor in parallel with said other resistors;

a plurality of voltage comparators each having one input connected to said output of said voltage monitoring means, a second input connected to a reference voltage, and an output, each comparator generating a signal on its output whenever said control voltage output exceeds said reference voltage;

a plurality of data flip flops, one each connected to the output of each comparator and having a complementary output connected to one of said switch means;

clock pulse generator means having an input connected to the input of said amplifier and an output for generating a pulse upon each zero crossing of the amplifier input voltage; and means connecting the output of said clock pulse generator to each of said data flip flops for triggering a signal on said complementary output of said data flip flop whereby said flip flop output signal is applied to said switch means at said zero crossings.

6. An improved gain control circuit in accordance with claim 5 wherein said switch means are field effect transistors.

7. An improved gain control circuit in accordance with claim 5 wherein said voltage monitoring means further comprises:

an amplifier having an input connected to the variable gain amplifier input and ouput;

a parallel resistor and capacitor; and a rectifying diode connected between the output of said amplifier and the parallel resistor and capacitor.

* * * * *

UNITED STATES PATENT AND TRADEMARK OFFICE
CERTIFICATE OF CORRECTION

PATENT NO. : 4,070,632

DATED : January 24, 1978

INVENTOR(S) : John R. Tuttle

It is certified that error appears in the above-identified patent and that said Letters Patent are hereby corrected as shown below:

Column 1, line 16, after "fidelity" insert --audio--;

Column 2, line 31, delete "embodment" and insert --embodiment--;

Column 3, line 60, before "sinusoidal" insert --the--.

Signed and Sealed this

Twenty-third Day of May 1978

[SEAL]

Attest:

RUTH C. MASON
Attesting Officer

LUTRELLE F. PARKER
Acting Commissioner of Patents and Trademarks